United States Patent
Goldfarb

(10) Patent No.: US 7,199,698 B1
(45) Date of Patent: Apr. 3, 2007

(54) DIGITALLY-CONTROLLED REFERENCE OSCILLATORS

(75) Inventor: Marc E. Goldfarb, Atkinson, NH (US)

(73) Assignee: Analog Devices, Inc., Norwood, MA (US)

( * ) Notice: Subject to any disclaimer, the term of this patent is extended or adjusted under 35 U.S.C. 154(b) by 2 days.

(21) Appl. No.: 10/819,597

(22) Filed: Apr. 6, 2004

(51) Int. Cl.
H03B 5/12 (2006.01)

(52) U.S. Cl. .............................. 337/177 V; 331/36 C; 331/117 FE

(58) Field of Classification Search ................ 257/312, 257/595, 598, 600, 601; 327/581, 566; 331/177 V, 331/36 C, 117 FE; 361/277, 278, 280, 281
See application file for complete search history.

(56) References Cited

U.S. PATENT DOCUMENTS

| | | | |
|---|---|---|---|
| 5,777,524 A | 7/1998 | Wojewoda et al. ......... | 331/116 |
| 5,926,064 A * | 7/1999 | Hariton ...................... | 327/581 |
| 5,986,515 A | 11/1999 | Sakurai ...................... | 331/158 |
| 6,028,488 A | 2/2000 | Landman et al. ........... | 331/1 A |
| 6,268,776 B1 | 7/2001 | Faison et al. ............... | 331/116 |
| 6,281,761 B1 | 8/2001 | Shin et al. .................. | 331/116 |
| 6,362,699 B1 | 3/2002 | Fry ............................. | 331/176 |
| 6,549,764 B2 | 4/2003 | Welland ..................... | 455/260 |
| 6,646,499 B2 * | 11/2003 | Tiebout ....................... | 327/586 |

OTHER PUBLICATIONS

HongMo Wang A 9.8 GHz back-gate tuned VCO in 0.35 CMOS, IEEE interaction Solid-State Circuits Conference Feb. 15-17, 1999 pp. 406-407.*
Sedra et al. "Microelectronic Circuits" fifth edition Oxford University press p. 51.*
Maget, Judith, et al., "Comparison of CMOS VCOs for UMTS Tuned by Standard and Novel Varactors in Standard 0.25um Technology", pp. 1-4.
Kucera, Jacob, "3.6 GHz VCOs for Multi-band GSM Transceivers", pp. 1-4.
Typpo, J., "A Back Gate Tuned PFET VCO", Analog Integrated Circuits and Signal Processing, pp. 265-269, Kluwer Academic Publishers, 2002, The Netherlands.

* cited by examiner

Primary Examiner—Michael B Shingleton
(74) Attorney, Agent, or Firm—Koppel, Patrick, Heybl & Dawson

(57) ABSTRACT

Varactor and reference oscillator structures are provided that are particularly suited for integrated circuit fabrication and which provide excellent parameter performance (e.g., monotonicity, linearity, low phase noise and low differential and integral non-linearity) so that they are useful in a variety of wireless communication structures (e.g., cellular telephones).

13 Claims, 5 Drawing Sheets

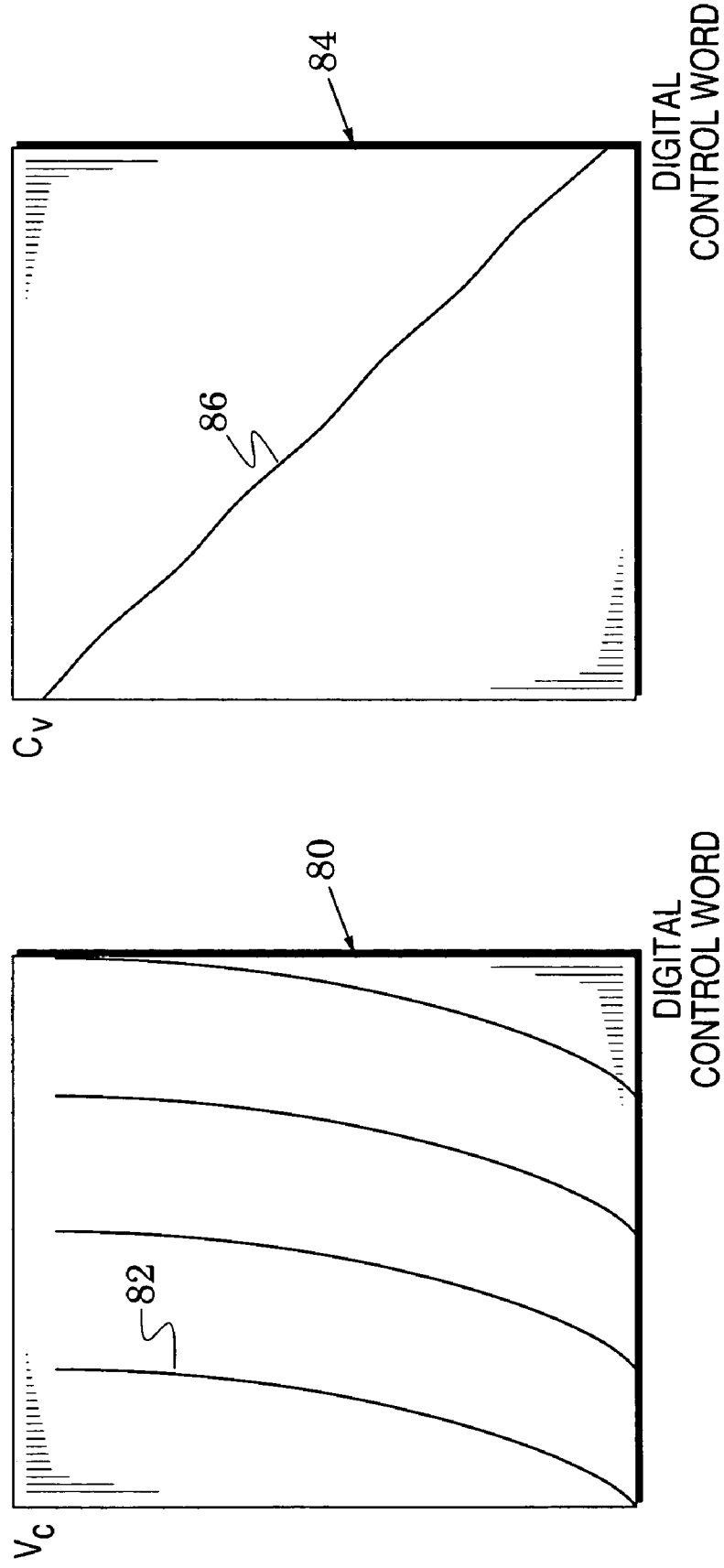

DIGITALLY-CONTROLLED REFERENCE OSCILLATORS

BACKGROUND OF THE INVENTION

1. Field of the Invention

The present invention relates generally to oscillators and, more particularly, to digitally-controlled reference oscillators.

2. Description of the Related Art

Modern wireless communication systems are used throughout the world and operate over a variety of frequency bands. For example, the global system for mobiles (GSM) has now been accepted in over 140 countries. This system includes the E-GSM 880–915 and 925–960 MHz transmitting and receiving bands for mobiles, 1710–1785 and 1805–1880 MHz transmitting and receiving bands for digital communications services (DCS), and 1850–1910 and 1930–1990 MHz transmitting and receiving bands for United States Personal Communications Services (PCS).

Components of these wireless systems (e.g., cellular telephones) require reference oscillators that can provide demanding technical performance (e.g., high stability, low phase noise and linear response to a tuning potential) while being restricted to occupy a small portion of a communication integrated circuit and being available for extremely low cost (e.g., less than one dollar). Although conventional reference oscillators have met the needs of previous wireless systems, they have generally failed to meet these more demanding requirements.

BRIEF SUMMARY OF THE INVENTION

The present invention is directed to reference oscillator structures that facilitate reduction of oscillator size and cost while meeting high performance requirements.

The novel features of the invention are set forth with particularity in the appended claims. The invention will be best understood from the following description when read in conjunction with the accompanying drawings.

BRIEF DESCRIPTION OF THE DRAWINGS

FIG. 4A is a graph of a transfer function of a digital-to-analog converter in the fine varactor of FIG. 3A and FIG. 4B is a graph of a corresponding transfer function of the fine varactor;

DETAILED DESCRIPTION OF THE INVENTION

Varactor (voltage-variable capacitor) structures are presented below that facilitate reference oscillators which can be reduced to a small portion of an integrated circuit and which provide excellent parameter performance (e.g., monotonicity, linearity, low phase noise and low differential and integral non-linearity) so that they are useful in a variety of wireless communication structures (e.g., cellular telephones).

Figure 1:
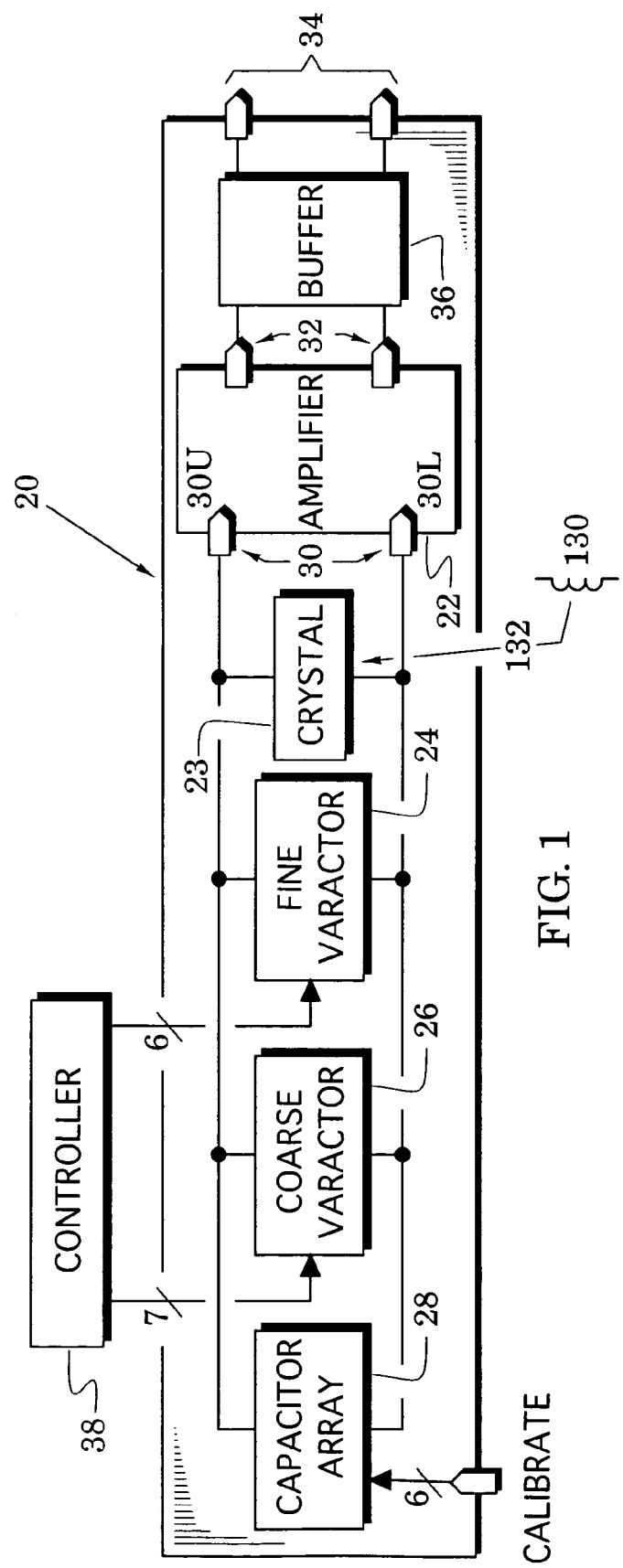
FIG. 1 is a block diagram of a reference oscillator embodiment of the present invention.

In particular, FIG. 1 illustrates a reference oscillator 20 that includes an amplifier 22, a crystal 23, a fine varactor 24, a coarse varactor 26 and a selectable capacitor array 28. The crystal, the fine and coarse varactors and the capacitor array are coupled across an input port 30 (formed by upper and lower input terminals 30U and 30L) of the amplifier 22 and an output port 32 of the amplifier is preferably coupled to an oscillator output port 34 by a buffer 36 which helps to isolate the amplifier from variable load conditions. In an embodiment of the oscillator 20, the fine and coarse varactors are controlled by 6-bit and 7-bit signals from a controller 38 and the capacitor array is controlled by a respective 6-bit calibrate control signal.

In general, the amplifier 22 can be any of various circuits that are configured to define a negative-impedance at its input port 30 while delivering its output signal at its output port 32. Therefore, the amplifier is configured to feedback a portion of its output signal to its input port to maintain the oscillation condition and, accordingly, may be considered to be a maintaining amplifier.

Figure 2:
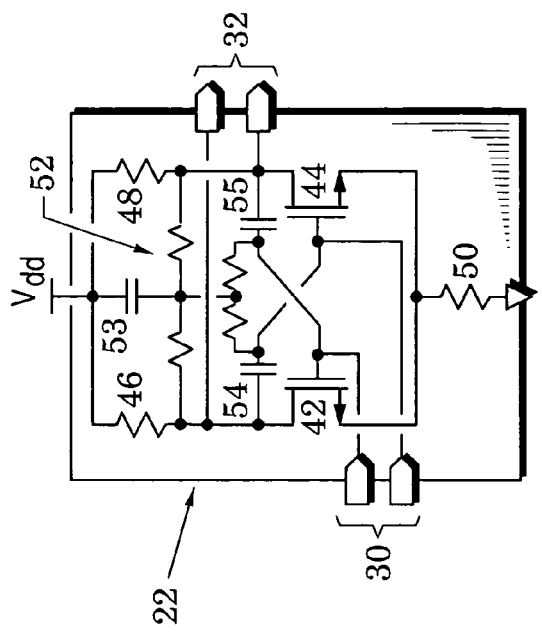
FIG. 2 is a schematic of an amplifier in the oscillator of FIG. 1.

An embodiment of the amplifier 22 is shown in FIG. 2 which illustrates a differential pair of first and second amplifier transistors 42 and 44 that each have a gate, a source and a drain. The transistor drains define the output port 32, the transistor gates define the input port 30 and the gates are cross coupled to the drains to provide the feedback that generates the negative impedance at the input port.

Drain resistors 46 and 48 couple the transistor drains to a bias voltage $V_{dd}$ and a resistor 50 is coupled to the transistor sources to form the "tail" of the differential pair. A balanced network 52 of resistors is coupled between the transistor gates and drains to set the biasing of the amplifier and an associated capacitor 53 bypasses common-mode signals to the bias rail to thereby maintain the balance. Finally, first and second capacitors 54 and 55 isolate the drain and gate biases.

In an important feature of the invention, the amplifier 22 is resistively biased to thereby enhance its reduction of phase noise in the output signal. Although not shown in FIG. 2, the drain and tail resistors (46, 48 and 50) are preferably adjustable (e.g., with transistor switches) so that the tail current can be adjusted over a current range (e.g., 200 to 1200 microamperes). When the oscillator signal is required, the tail current can be increased to reduce phase noise. When the oscillator signal is not required (e.g., during idle times of a cellular telephone that includes the reference oscillator), the tail current can be reduced to limit power usage and dissipation. In applications that are less concerned with phase noise, other oscillator embodiments may replace the drain and tail resistors with current sources.

Figure 3B:
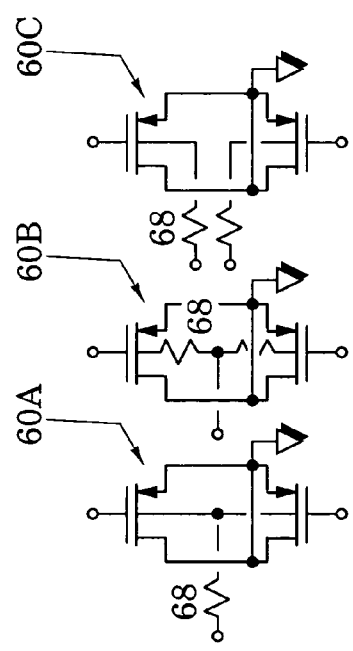
FIGS. 3A and 3B are schematics of a fine varactor in the oscillator of FIG. 1.
Figure 3A:
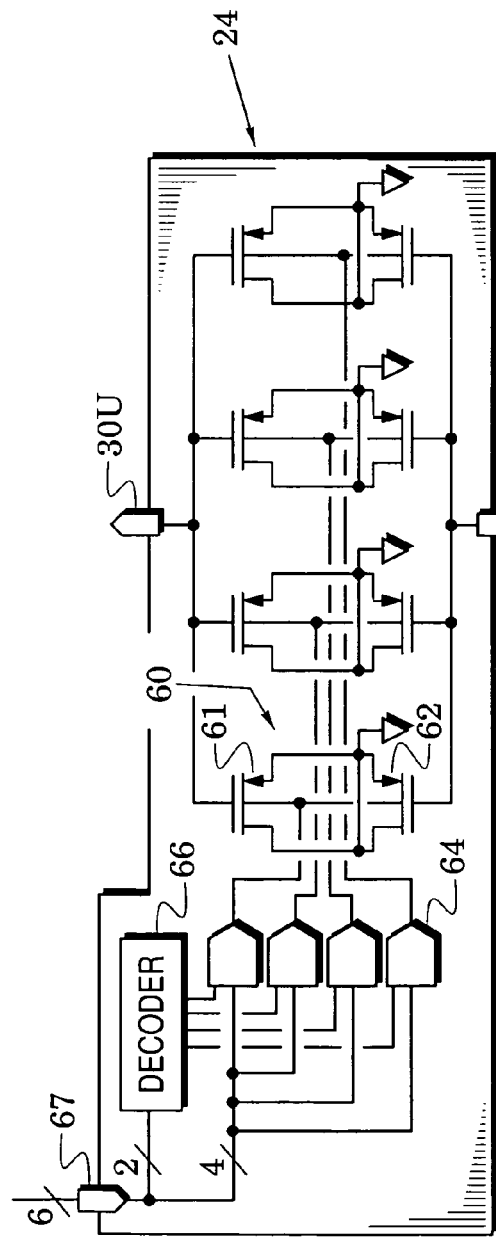

An embodiment of the fine varactor 24 is provided in FIG. 3A which shows sets 60 of first and second transistors 61 and 62 that each have a gate, a back gate, a source and a drain. All sources and drains of each set 60 are coupled to an oscillator potential (e.g., a ground potential), the gates are coupled across the amplifier input terminals (30U and 30L in FIG. 3A) to provide a capacitance, and the back gates are coupled together to receive a tuning potential that determines that capacitance.

In operation of a set 60, a tuning potential on the coupled back gates of the transistors 61 and 62 alters the transistors' source-to-gate capacitance and drain-to-gate capacitance so that the set provides a transfer function of output capacitance versus input tuning potential. The arrangement of the set provides a balanced structure so that, in response to oscillation signals across the terminals 30U and 30L, the capacitances of both transistors vary equally in response to the tuning potential.

Accordingly, the junctions of the coupled sources and coupled drains are signal nulls which may be coupled to a fixed oscillator potential without substantially affecting the oscillator signals. It has been found that the potential chosen will affect the set's transfer function (output capacitance as a function of input tuning potential) and that a ground potential is particularly effective in enhancing the transfer function's monotonicity. In addition, it has been found that the balanced varactor arrangement provides an unusually high sensitivity (i.e., a high $C_{max}$ to $C_{min}$ ratio wherein $C_{max}$ and $C_{min}$ are respectively the greatest and least capacitances produced by the tuning potential). In a P-type metal-oxide-semiconductor (PMOS) Field Effect Transistor embodiment, for example, the set 60 has been found to provide a capacitance ratio on the order of 1.4:1 in response to a tuning potential variation of 0.2–2.3 volts.

Because of the balanced structure of the set 60, the junction between the back gates is also the site of a signal null so that it can be directly coupled to receive a tuning potential as shown in FIG. 3A. Alternatively, the back gates can be coupled to the tuning potential through a resistor to further enhance signal isolation. For example, a set 60A of FIG. 3B couples both back gates through a common resistor 68 to a common tuning potential, a set 60B couples each back gate through a respective resistor 68 to a common tuning potential, and a set 60C couples each back gate through a respective resistor 68 to a respective (and possibly different) tuning potential.

Although the transistors 61 and 62 are shown as P channel devices in FIG. 3A, other embodiments of the set 60 may be effectively formed with N channel devices. In addition, different embodiments of the back gates of the set 60 have been found useful. For example, the back gates may be formed in a common substrate well or, alternatively, formed in respective wells that are coupled by an integrated circuit metal structure.

The capacitive range of the fine varactor 24 is enhanced by combining a plurality of the sets 60 in parallel. The fine varactor 24 of FIG. 3A, for example, is shown to have four parallel sets. This varactor also includes a decoder 66 and four digital-to-analog converters (DACs) 64 which are each coupled between the decoder and a respective one of the sets 60. Two of the 6 bits from the controller (38 in FIG. 1) are used by the decoder to successively enable and control the DACs and the remaining four bits are converted in the DACs to analog potentials that are applied to the back gates of the sets 60.

With this arrangement, the decoder 66 can first enable the upper DAC of FIG. 3A which can then apply 16 different potential levels to the back gates of the leftmost set 60 (in response to the four DAC bits). Locking this DAC to thereby fix its set in its maximum capacitance state, the decoder 38 can now enable the next DAC in line so that this DAC can then apply 16 different potential levels to the back gates of the next set 60.

Continuing in this manner, the decoder and associated DACs cause the capacitance between the terminals 30U and 30L to assume 64 discrete values as it ramps from a maximum capacitance to a minimum capacitance. The decoder 66, therefore, receives its control bits and, in response, properly disables, enables and locks each of the DACs 64 in a successive manner. The decoder control structure to each DAC thus includes sufficient information (e.g., 2 bits) to control these processes.

In an important feature of the invention, the transfer function of the DACs 64 is altered to enhance the linearity of the transfer function of the fine varactor 24. FIGS. 4A and 4B show exemplary DAC transfer functions and a resulting varactor transfer function. In the graph 80 of FIG. 4A, each transfer function plot 82 corresponds to a respective one of the DACs 64 of FIG. 3A and shows control voltage ($V_C$) generated by the DAC as a function of the digital control word applied to the DAC.

For example, the leftmost plot 82 indicates the transfer function of the uppermost DAC 64 in FIG. 3A. This plot has a shape (e.g., approximately proportional to the square of the control word's magnitude) that enhances the linearity of the transfer function of the varactor set (60 in FIG. 3A) that corresponds to this DAC. Others of the plots 82 have a similar shape and each correspond to a respective one of the other varactor sets.

The graph 84 of FIG. 4B illustrates a plot 86 of the resulting transfer function of the fine varactor (24 in FIG. 3A). The plot shows that the varactor capacitance ($C_V$) is substantially linear with respect to the digital control word from the controller (38 in FIG. 1). A slight nonlinear periodicity has been exaggerated to show the intersections between the portions of the transfer functions contributed by each of the sets 60 of transistors 61 and 62 of FIG. 3A.

It is intended that the fine varactor (24 in FIG. 1) provides a fine tuning range that spans the range between each tuning step of the coarse varactor (26 in FIG. 1). That is, each coarse tuning step should substantially match the tuning range of the fine varactor. This is realized in the coarse varactor embodiment of FIG. 5 with varactor groups 100 that are each formed with four of the sets 60 as was done in the fine varactor 24 of FIG. 3A. In contrast, however, the back gates of all of the sets of each group 100 are coupled together and coupled to receive a common tuning potential from a decoder 102.

The decoder 102 that receives the 7-bit signal from the controller (38 in FIG. 1) is preferably a thermometer decoder. As the controller word increases, the decoder initially steps a tuning potential of a first group from a maximum to a minimum value to thereby alter the group's capacitance from a minimum to a maximum value. In response to a further increase in the controller word, the decoder steps a tuning potential of a next group from a maximum to a minimum value to thereby alter this group's capacitance from a minimum to a maximum value. At this point, the capacitance of two groups has been altered from their minimum to their maximum capacitance and the capacitance of the remaining groups remain at their minimum values.

Figure 5:
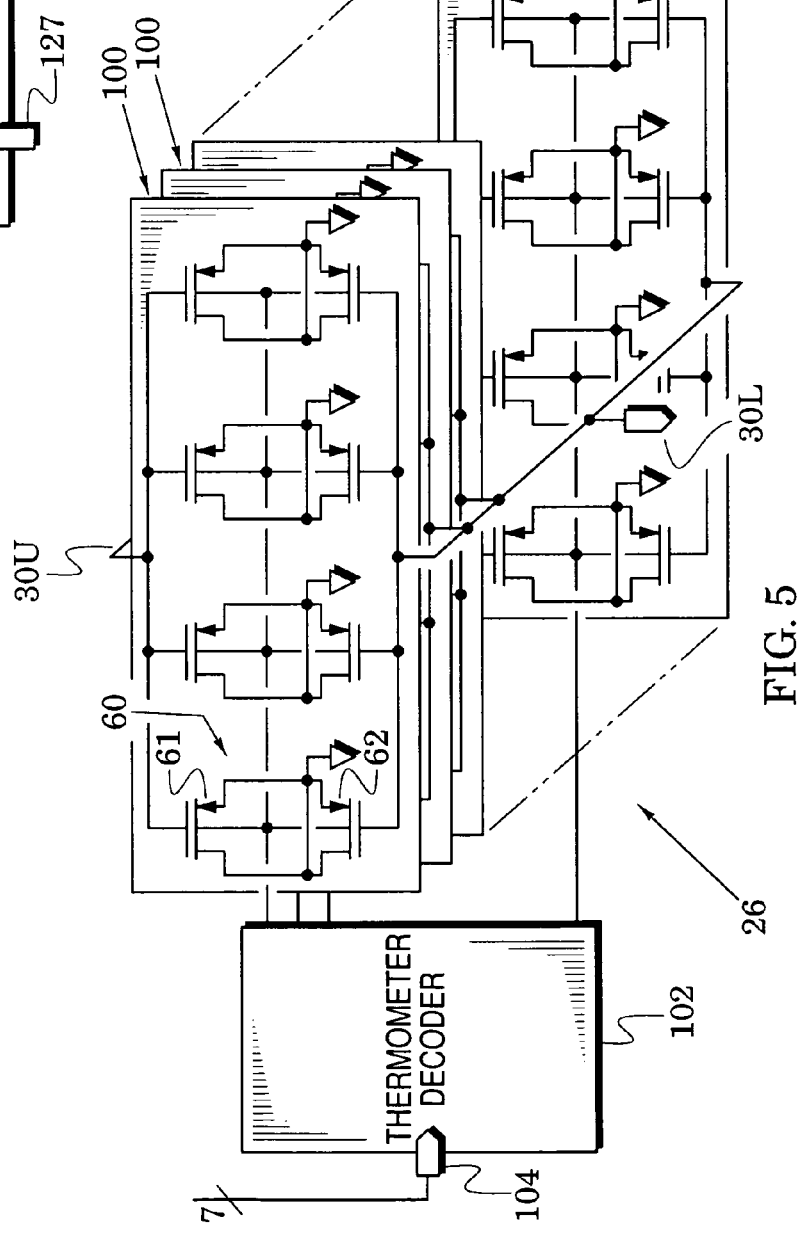
FIG. 5 is a schematic of a coarse varactor in the oscillator of FIG. 1.

In an exemplary embodiment, the coarse varactor 26 of FIG. 5 includes 127 of the groups 100 coupled between amplifier input terminals 30U and 30L. Each group has a difference of approximately 69 femtofarads (fF) between its minimum and maximum capacitance. Accordingly, thermometer decoder 102 can progressively alter the capacitance across the amplifier input port (30 in FIG. 1) over a range on the order of 127×69=8.76 picofarads (pF). In this embodiment, the fine varactor 24 of FIG. 3A would then provide 64 capacitance steps that would, together, span the 69 fF between any selected pair of the groups 100 of FIG. 5 (resulting in 8192 steps of approximately 1.06 fF each over a range of 8.83 pF).

In a different embodiment, the groups 100 may be configured to provide coarse capacitance steps that are binarily related. This embodiment would significantly reduce the number of groups 100 and would be compatible with a binary decoder that would replace the thermometer decoder 102. Many of the applications for the oscillator 20 of FIG. 1 envision its use in a control loop where it is important that the oscillator's transfer function be monotonic and reasonably linear. If errors in the binarily-related capacitance values of this different embodiment are sufficient, it is possible to have a capacitance decrease for some values of the input control word at the coarse varactor's input terminal 104.

Because the thermometer decoder 102 adds or subtracts groups 100 that all have (essentially) the same capacitance, the coarse varactor embodiment of FIG. 5 is necessarily monotonic and its transfer function (output capacitance versus input control word) is substantially linear.

Together, the fine and coarse varactors of FIGS. 3A and 5 provide a monotonic and substantially linear capacitance variation across the input port 30 of the amplifier 22 of FIG. 1 in response to control words from the controller 38. In some uses of the oscillator 20 of FIG. 1, it is also helpful to have a calibration adjustment of the oscillator that insures that the tuning range of the fine and coarse varactors is substantially centered on the desired oscillator frequency.

Figure 6:
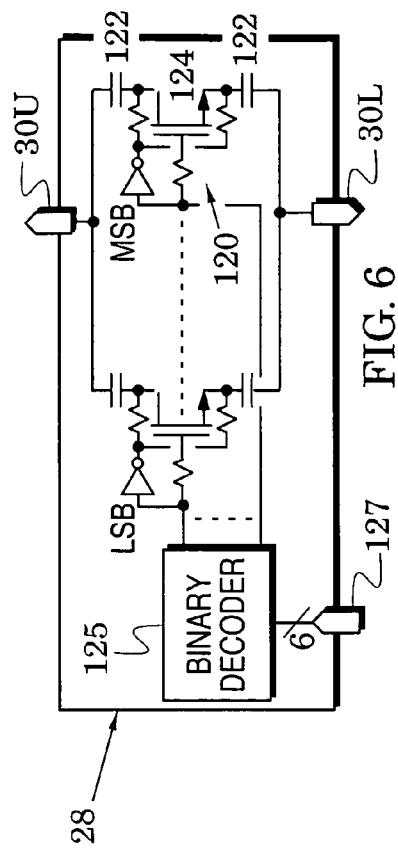
FIG. 6 is a schematic of a selectable capacitor array in the oscillator of FIG. 1.

Accordingly, FIG. 6 illustrates an array 28 of selectable capacitors. In particular, the array includes an array of capacitors 122 and an array of transistors 124 that are each positioned between a pair of the capacitors to form calibrate units 120. The transistors (shown with corresponding bias resistors and inverter) respond to a binary decoder 125 which receives a 6-bit calibrate signal from a port 127. The pairs of capacitors are preferably configured to have binarily-related capacitances so that the capacitance of the calibrate units 120 range from a least significant bit (LSB) unit to a most significant bit (MSB) unit.

In operation, the 6-bit control word can selectively turn on the transistors 124 in the calibrate units 120 to thereby realize 64 capacitance steps which are separated by the capacitance of the LSB unit. In an embodiment of the capacitor array, the capacitors 122 are sized to provide an LSB capacitance on the order of 200 fF. These step sizes are relatively large so that capacitance errors can be sufficiently controlled to maintain monotonicity in the capacitor array's transfer function. An exemplary component of this control sizes the transistors 124 so that their capacitances in their "off" states follow a binary relationship and, accordingly, help to insure the array monotonicity.

In operation of the reference oscillator 20 of FIG. 1, the cross coupling of the amplifier 22 generates a negative impedance at the input port 30. In particular, it is believed that it generates a negative resistance which cancels positive resistance (e.g., in the form of losses of the crystal 23 and parasitics of the fine and coarse varactors 24 and 26 and the capacitor array 28) at this port to thereby maintain the oscillation condition. It is further believed that reactive elements of the crystal (e.g., serially-coupled inductor and capacitor) resonate in a series mode and the capacitance of the fine and coarse varactors 24 and 26 and the capacitor array 28 pulls this resonant mode over a restricted bandwidth.

Initially, the 6-bit calibrate signal of the capacitor array 28 is used to remove any basic frequency error of the oscillator. Preferably, the controller 38 initially places the coarse and fine varactors 24 and 26 approximately in the middle of their adjustment ranges (e.g., by applying a code of 4608 which is near the middle of the 13-bit range (7-bit coarse range and 6-bit fine range). The 6-bit calibrate signal is then selected to place the frequency of the output signal (at the oscillator's output port 34) at or near the desired reference frequency (e.g., 26 MHz). The capacitors (122 in FIG. 6) are sized so that the LSB of the capacitor array of FIG. 6 is appropriate and sufficient (e.g., 200 fF) for this initial alignment of the reference oscillator.

Once the capacitor array 28 has been adjusted to remove the initial frequency error, the controller 38 is used to adjust the frequency via its 7-bit and 6-bit control signals to the fine and coarse varactors 24 and 26. Extensive testing of the reference oscillator structure has shown that the controller can then maintain the desired reference frequency by means of its control of the coarse and fine varactors. In particular, the testing considered various frequency-disturbing parameters (such as tail current variations in the amplifier (22 in FIG. 1), variations of crystals (23 in FIG. 1) from different manufacturers and temperature-induced variations of crystal frequency) and verified that the coarse and fine varactors provide sufficient tuning range to offset these variations.

It was noted above that the coarse and fine varactors (22 and 23 in FIG. 1) provide a combined transfer function of capacitance versus tuning potential (or control word) that is substantially linear. Because this tuning capacitance is a relatively small portion of the total capacitance across the amplifier input port (30 in FIG. 1), the oscillator's transfer function of frequency versus tuning potential is also substantially linear. Although different embodiments of the coarse and fine varactors can be structured to provide substantially constant frequency steps rather than substantially constant capacitance steps, these embodiments require considerably more complex structures.

Although the reference oscillator 20 of FIG. 1 has been described above to have the crystal 23 coupled across the amplifier input port 30, it is noted that other reactive components can be substituted to form different oscillators. FIG. 1 shows that an inductor 130, for example, can be substituted for the crystal 23 as indicated by substitution arrow 132 (in another example, a serially-coupled inductor and capacitor may be used). Accordingly, the reference oscillator can now be tuned over a greater frequency band but its phase noise will be degraded.

Although the amplifier 22 of FIG. 1 has been shown in an embodiment (FIG. 2) to comprise a cross-coupled differential amplifier, various other amplifier structures (e.g., capacitive divider feedback structures of Pierce, Colpitts and Clapp oscillators) that employ feedback to realize negative-impedance can be used in other embodiments of the invention.

Figure 7:
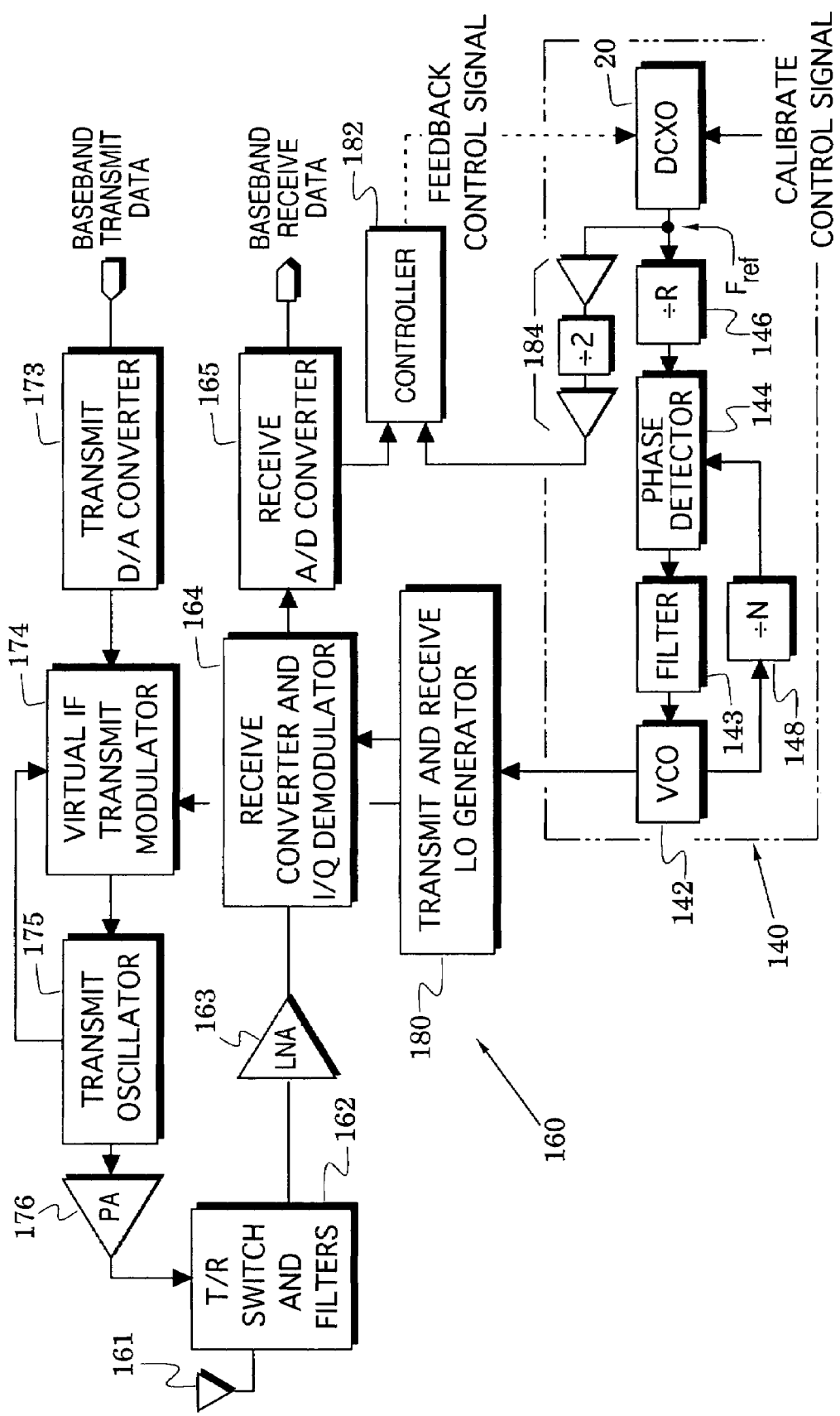
FIG. 7 is a block diagram of a wireless radio that includes the oscillator of FIG. 1.

The reference oscillator illustrated in FIGS. 1–6 is particularly suited for use in the synthesizer 140 of FIG. 7. In addition to the reference oscillator 20 (labeled as a digitally-controlled crystal oscillator (DCXO, the synthesizer includes a voltage-controlled oscillator (VCO) 142, a filter 143, a phase detector 144 and frequency dividers 146 and 148.

In operation, the DCXO provides a reference signal with a reference frequency $F_{ref}$. The frequency divider 146 divides this reference signal by a factor R and couples this divided signal to the phase detector. The frequency divider 148 divides by a factor N and couples a feedback signal from the VCO to the phase detector. In response to these signals from the frequency dividers, the phase detector provides a control signal to low-pass filtering of the filter 143 to the VCO.

Accordingly, the action of the feedback loop causes the synthesized frequency from the VCO to be $(N/R)F_{ref}$. Thus, the synthesizer 140 can provide a signal whose frequency is rapidly altered by appropriate selections of N and R and whose stability and phase noise is enhanced by the excellent stability and phase noise of the DCXO.

As shown in FIG. 7, an exemplary application of the synthesizer 140 is to provide a synthesized signal to a direct downconversion radio 160. The radio includes an antenna 161 and a transmit/receive switch and filters 162. Coupled in series from the T/R switch and filters are a low-noise amplifier (LNA) 163, a receive converter and I/Q demodulator 164 and a receive analog-to-digital converter (ADC) 165. Coupled in series to the T/R switch and filters 162 are a transmit DAC 173, a virtual IF transmit modulator 174, a transmit oscillator 175 and a power amplifier (PA) 176.

A transmit and receive local oscillator (LO) generator 180 typically includes at least one frequency divider and provides different LO signals to the receive converter and I/Q demodulator 164 and the virtual IF transmit modulator 174 that are referenced to the synthesized signal of the synthesizer 140. With its LO signal, the receive converter and I/Q demodulator 165 downconverts (and demodulates) signals received from the antenna 161 to an intermediate frequency or to baseband at which point they are directly converted by the receive ADC 165 to baseband receive data.

Baseband transmit data is converted to analog signals in the transmit DAC 173 and these signals are provided to the virtual IF transmit modulator 174. Signals from the transmit oscillator 175 drive the PA 176 and are also fed back to the virtual IF transmit modulator 174 to form a phase-lock loop that offsets the transmit frequency from the receive frequency and modulates it with the analog signals from the transmit DAC 173.

Because the reference oscillator 20 of FIGS. 1–6 is structured for realization with components (e.g., MOS transistors, resistors and capacitors) that are compatible with fabrication processes of integrated circuits, all of its structures (except the crystal 23 of FIG. 1) can be restricted to a small portion of an integrated-circuit package (chip). This feature facilitates incorporation of major portions of the radio 160 into a single chip.

A tone is typically included in the signals that are received from the antenna 161 of FIG. 7 and a controller 182 receives a sample of this tone, e.g., from the receive ADC 165. Through a serially-connected combination 184 of a buffer amplifier, a frequency divider and an output amplifier, the controller also receives a sample of the reference signal of the DCXO 20 and it compares these signals and provides a feedback control signal that causes the frequency of the DCXO to be in accordance with the received tone. The frequency divider can be selectively bypassed to permit selective comparison of the reference with different frequency tones (e.g., tones of 13 MHz and 26 MHz).

In particular, the controller 182 basically performs the functions of the controller 38 of FIG. 1 and the feedback control signal corresponds to the 7-bit and 6-bit control signals generated by that controller. The frequency of the DCXO 20 of FIG. 7 can be initially calibrated by its calibrate control signal which corresponds to the calibrate signal of FIG. 1 that is applied to the capacitor array 28.

The radio 160 of FIG. 7 may have reception gaps during which the feedback control signal is not available. Although the frequency of the DCXO may drift somewhat during this absence (due, for example, to temperature changes), the coarse and fine varactors 26 and 24 of FIG. 1 are structured (as described above) to have sufficient range to pull the DCXO back to correspond to the tone upon termination of the reception gap.

The monotonicity and linearity of the coarse and fine varactors (26 and 24 in FIG. 1) has been discussed above. The structures of these varactors also facilitate fabrication control processes that realize reference oscillators with exceptionally low differential non-linearity (step to step variation from the expected value) and integral non-linearity (total deviation from the expected value) as they are tuned across their frequency range. This is an important parameter when the reference oscillators are embedded in a feedback loop or used in a direct downconversion radio as in FIG. 7. In addition, it has been found that these structures facilitate the realization of low phase noise (e.g., −153 dBc/Hz at 100 KHz offset).

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A digitally-controlled reference oscillator that generates a reference signal with a reference frequency that corresponds to coarse and fine digital command signals, the oscillator comprising:

an amplifier having an input port and configured to provide said reference signal with a frequency that corresponds to varactor capacitance across said input port;

a crystal coupled across said input port;

M varactor systems that each includes N sets of varactor transistors wherein each set has a tuning terminal and capacitor terminals and wherein:

in each of M-1 of said varactor systems, the tuning terminals of all sets are coupled to receive a respective one of coarse tuning potentials and the capacitance terminals of all sets are coupled across said input port to provide a coarse varactor capacitance that is a function of said respective coarse tuning potential; and in a remaining one of said varactor systems, the tuning terminal of each of said sets is coupled to receive a respective one of fine tuning potentials and the capacitance terminals of all sets are coupled across said input port to provide a fine varactor capacitance that is a function of said respective fine tuning potential;

a coarse decoder that, in response to successive states of said coarse digital command signal, steps the coarse tuning potential of successive ones of said M-1 varactor systems from a maximum analog value to a minimum analog value to thereby successively add coarse varactor capacitances across said input port;

N digital-to-analog converters that each provide a respective one of said fine tuning potentials; and a fine decoder that, in response to successive first states of said fine digital command signal, enables successive ones of said converters so that each of said converters, in response to successive second states of said fine digital command signal, successively increases the fine tuning potential of a respective one of said sets along a transfer-function shape from said maximum analog value to said minimum analog value to thereby successively increase a fine varactor capacitance across said input port;

the capacitance across said input port thereby monotonically increasing in a substantially-linear progression.

2. The oscillator of claim 1, wherein each of said sets includes first and second varactor transistors having gates, back gates, sources and drains wherein:
  said back gates are coupled together to form said tuning terminal;
  said gates form said capacitance terminals; and
  said sources and drains are coupled to a common potential.

3. The system of claim 2, wherein said first and second varactor transistors are P-type metal-oxide-semiconductor transistors.

4. The system of claim 2, wherein said first and second varactor transistors are N-type metal-oxide-semiconductor transistors.

5. The oscillator of claim 1, wherein said amplifier includes:
  a resistive network;
  a differential pair of amplifier transistors having bases that form said input port, having emitters connected to receive a tail current, and having collectors that steer said tail current across said resistive network to provide said reference signal; and
  first and second capacitors that are each cross-coupled between a base of a respective one of said amplifier transistors and a drain of the other of said amplifier transistors.

6. The oscillator of claim 1, wherein said transfer-function shape is substantially determined by the square of the corresponding analog magnitude of said second states.

7. The oscillator of claim 1, wherein said coarse digital command signal is a 7-bit signal and M is 128.

8. The oscillator of claim 7, wherein N is 4 and said fine digital command signal is a 6-bit signal.

9. The oscillator of claim 1, further including an array of selectable calibration capacitors coupled across said input port.

10. A digitally-controlled synthesizer that generates a synthesizer signal with a synthesizer frequency that corresponds to coarse and fine digital command signals, the synthesizer comprising:
  a voltage-controlled oscillator that provides said synthesizer signal in response to a control voltage;
  a phase detector that provides said control voltage in response to first and second divider signals;
  a first frequency divider that provides said first divider signal in response to said synthesizer signal;
  a second frequency divider that provides said second divider signal in response to a reference signal; and
  a digitally-controlled reference oscillator that generates said reference signal with a reference frequency that corresponds to coarse and fine digital command signals, wherein said oscillator includes:
  an amplifier having an input port and configured to provide said reference signal with a frequency that corresponds to varactor capacitance across said input port;
  a crystal coupled across said input port;
  M varactor systems that each includes N sets of varactor transistors wherein each set has a tuning terminal and capacitor terminals and wherein:
    in each of M-1 of said varactor systems, the tuning terminals of all sets are coupled to receive a respective one of coarse tuning potentials and the capacitance terminals of all sets are coupled across said input port to provide a coarse varactor capacitance that is a function of said respective coarse tuning potential; and
    in a remaining one of said varactor systems, the tuning terminal of each of said sets is coupled to receive a respective one of fine tuning potentials and the capacitance terminals of all sets are coupled across said input port to provide a fine varactor capacitance that is a function of said respective fine tuning potential;
  a coarse decoder that, in response to successive states of said coarse digital command signal, steps the coarse tuning potential of successive ones of said M-1 varactor systems from a maximum analog value to a minimum analog value to thereby successively add coarse varactor capacitances across said input port;
  N digital-to-analog converters that each provide a respective one of said fine tuning potentials; and
  a fine decoder that, in response to successive first states of said fine digital command signal, enables successive ones of said converters so that each of said converters, in response to successive second states of said fine digital command signal, successively increases the fine tuning potential of a respective one of said sets along a transfer-function shape from said maximum analog value to said minimum analog value to thereby successively increase a fine varactor capacitance across said input port;
  the capacitance across said input port thereby monotonically increasing in a substantially-linear progression.

11. The synthesizer of claim 10, wherein each of said sets includes first and second varactor transistors having gates, back gates, sources and drains wherein:
  said back gates are coupled together to form said tuning terminal;
  said gates form said capacitance terminals; and
  said sources and drains are coupled to a common potential.

12. The synthesizer of claim 10, wherein said amplifier includes:
  a resistive network;
  a differential pair of amplifier transistors having bases that form said input port, having emitters connected to receive a tail current, and having collectors that steer said tail current across said resistive network to provide said reference signal; and
  first and second capacitors that are each cross-coupled between a base of a respective one of said amplifier transistors and a drain of the other of said amplifier transistors.

13. The synthesizer of claim 10, wherein said transfer-function shape is substantially determined by the square of the corresponding analog magnitude of said second states.

* * * * *